United States Patent [19]
Müller et al.

[11] 4,091,374
[45] May 23, 1978

[54] METHOD FOR PICTORIALLY DISPLAYING OUTPUT INFORMATION GENERATED BY AN OBJECT IMAGING APPARATUS

[75] Inventors: Karl-Heinz Müller; Reinhard Schliepe; Volker Rindfleisch, all of Berlin, Germany

[73] Assignee: Siemens Aktiengesellschaft, Munich, Germany

[21] Appl. No.: 719,112

[22] Filed: Aug. 31, 1976

[30] Foreign Application Priority Data

Sep. 3, 1975 Germany ............................. 2539677

[51] Int. Cl.² ........................................... G06K 15/20
[52] U.S. Cl. ............................ 340/324 AD; 250/311; 358/183
[58] Field of Search ................ 250/311; 358/107, 127, 358/183; 340/324 AD

[56] References Cited
U.S. PATENT DOCUMENTS 3,652,790  3/1972  Eberhardt ............................. 358/183
3,835,246  9/1974  Muller et al. ......................... 250/311
3,943,280  3/1976  Kimura et al. ........................ 358/183

Primary Examiner—David L. Trafton
Attorney, Agent, or Firm—Kenyon & Kenyon, Reilly, Carr & Chapin

[57] ABSTRACT

A method for pictorially displaying output information generated in the form of an electrical signal by an apparatus for imaging an object which includes a first display means for visually displaying a working image of the object and a second display means for visually displaying an orientation image of the object. The orientation image is obtained by varying the operating parameters of the apparatus and is displayed simultaneously with the working image. The improvement of the invention comprises the steps of generating the orientation image once, storing the orientation image in an image storage means, and then reproducing the orientation image from the generated image stored in the image storage means.

4 Claims, 4 Drawing Figures

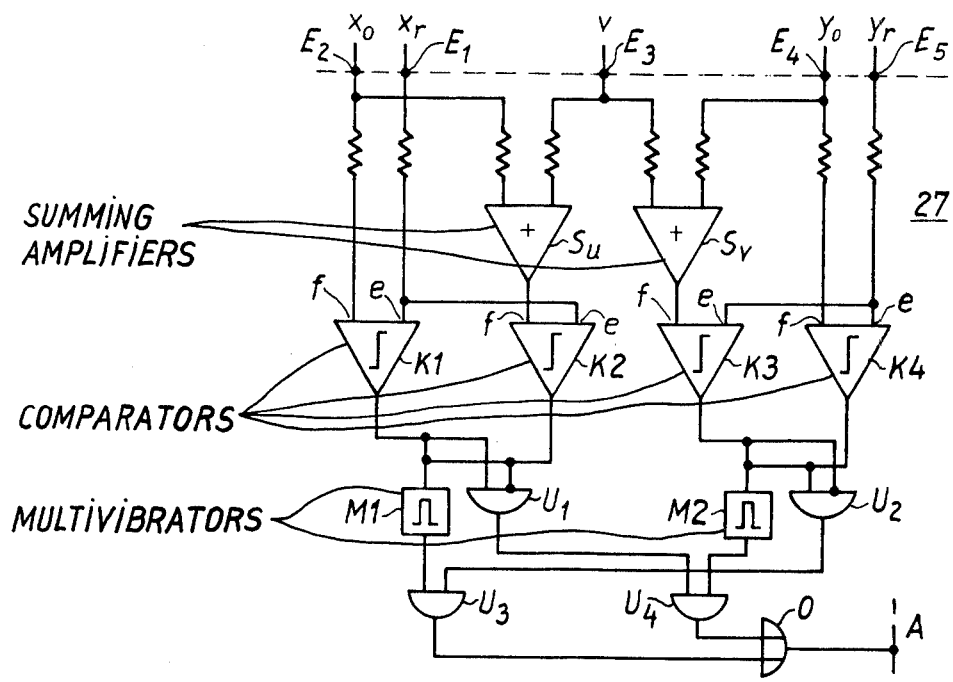
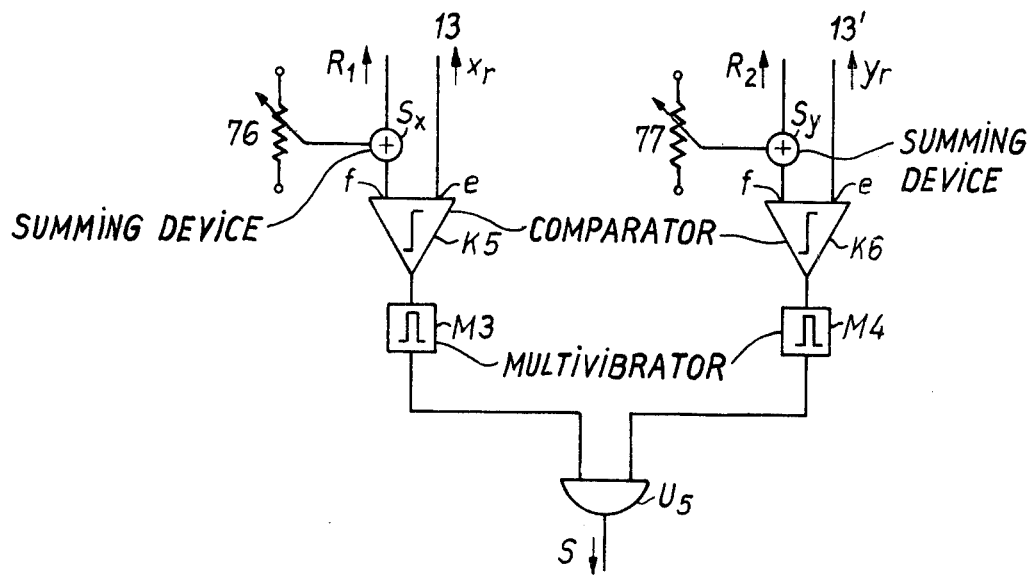

METHOD FOR PICTORIALLY DISPLAYING OUTPUT INFORMATION GENERATED BY AN OBJECT IMAGING APPARATUS

BACKGROUND OF THE INVENTION

1. Field of the Invention

The present invention relates generally to object imaging methods, and in particular to an improved method for pictorially displaying output information generated in the form of an electrical signal by an object imaging apparatus.

2. Description of the Prior Art

Methods for pictorially displaying the output information of an object imaging apparatus are known in the art for use in conjunction with a scanning electron microscope. See the Journal of Physics E4, No. 11, pp. 837–842 (1971). In such methods, a working image of an object is generated on a first television monitor and an orientation image is generated on a second television monitor. The orientation image is generated by changing the operating parameters of the object imaging apparatus and is displayed simultaneously with the working image.

An electron microscope basically has two modes of operation. In one of the modes, a direct image of a segment of a specimen is generated by utilizing the usual scanning techniques and is reproduced on a television monitor. In the other of the modes, a channelling diagram of one point of the specimen segment displayed on the television monitor is generated and then reproduced on the second television monitor. Between these two modes of operation, the operating parameters of the electron microscope are switched at the frame frequency of the television monitors (which, for example, in Europe, is 50 Hz). The working and orientation images are, thus, generated alternately on the two display monitors.

In order to display the working and orientation images on the two television monitors without flickering, the switching of the operating parameters of the microscope between the described modes of operation must be carried out as frequently as possible. However, because of equipment limitations, there are also limits as to how frequently the switching can be carried out. For example, in an apparatus which is described in the above-referenced Journal of Physics pages, switching of the operating parameters of the microscope is carried out by varying the excitation of the magnetic lens of the microscope which is disposed after the microscope deflection system along the beam path. Since such magnetic lenses are generally constructed in the form of iron coils, variation of the excitation of the lens is almost always accompanied by eddy current phenomena.

The switching between the operating modes and the microscope may also be carried out at the line (horizontal) frequency of the television monitors. See Proceedings of the Fifth Annual Scanning Electron Microscope Symposium, IIT Research Institute, Chicago, Ill., pp. 49–56 (April 1972). In commercially available television monitors with 625 lines, this line frequency would be 31,250 Hz. By varying the excitation of the deflection systems of the monitors, images of different magnification may be generated on the television monitors. The monitor with the greater magnification will then reproduce a segment of the image with the smaller magnification. This segment is identified by a marker window disposed within the image. However, because of the equipment limitations previously mentioned, only limited variation of the mode of operation of the microscope can be achieved with such a method. Thus, for example, all variations which require variation of the excitation of one or more magnetic lenses are eliminated. To implement such variations, known methods require considerable electronic circuitry to be used since the switching from one mode of microscope operation to the other must be performed at the frame or line frequency of the television monitors. Moreover, the switching must be performed at short time intervals in order to avoid flickering of the displayed working and orientation images. As a result, known methods for comparative observation of the working and orientation images can be used only if the changes in the operating parameters of the imaging apparatus can be carried out in an extremely short period of time. It is, accordingly, impossible, for example, to compare the images before and after inserting a diaphragm into the imaging apparatus.

SUMMARY OF THE INVENTION

It is therefore an object of the present invention to overcome the disadvantages of heretofore known object imaging methods and to provide an improved method for pictorially displaying output information generated in the form of an electrical signal by an object imaging apparatus.

It is also an object of the invention to provide an improved method for pictorially displaying output information generated in the form of an electrical signal by an object imaging apparatus which permits a working and an orientation image to be generated and reproduced even when considerable variation of the operating parameters of the imaging apparatus are required to generate the images.

It is still another object of the present invention to provide an improved method for pictorially displaying output information generated in the form of an electrical signal by an object imaging apparatus which permits the circuitry required for generating and reproducing the images to be minimized.

These and other objects of the invention are achieved in a method for pictorially displaying output information generated in the form of an electrical signal by an apparatus for imaging an object. The apparatus includes a first display means for visually displaying a working image of the object and a second display means for visually displaying an orientation image of the object. The orientation image is obtained by varying the operating parameters of the apparatus and is displayed simultaneously with the working image. The improvement of the invention comprises the steps of generating the orientation image once, storing the orientation image in an image storage means, and reproducing the orientation image from the generated image stored in the image storage means.

Generally speaking, the orientation image is generated prior to generation of the working image. The invention thus enables the working image to be generated without gaps independently of the generation of the orientation image. It also enables continuous reproduction of the orientation and working images.

In one embodiment of the invention, the method further comprises the step of linking the orientation image to the working image by means of a reference marking. This enables unequivocal information to be obtained regarding the relation of the working and orientation images with respect to each other. The orientation image may be stored, for example, in an electronic image storage device, such as a video recorder. It is of particular advantage, however, to store the orientation image in an electronic image storage tube, such as the double-ended tube described in Proceedings of the Fifth Annual Scanning Electron Microscope Symposium, IIT Research Institute, Chicago, Ill., pp. 41–46 (April 1972). The particular advantage of this tube is that the storage and reproduction of the orientation image can be carried out independently with respect to time and at different operating speeds.

In a scanning electron microscope, the invention provides the advantage of permitting a picture to be used as the orientation image which takes a considerable amount of time to generate. Such a situation is generally encountered when the low-intensity secondary x-rays emanating from the object examined comprise the output information of the scanning electron microscope. When the invention is used in a stationary-image transmission-type electron microscope, the orientation image may comprise, for example, a diffraction image of an area of the object and the working image may comprise an image of the same area of the object, both obtained by means of conventional imaging techniques. The image generated may be a bright or dark field image, and the dark field image may, in addition, be correlated with a reflex in the orientation image. If the previously-described reference marking is utilized, this reflex may be identified by the reference marking.

The working image may also be displayed as a segment of the area of the object which is viewed with the aid of the orientation image. Conversely, the orientation image may be generated as a direct image of an area of the object which is obtained by the usual imaging techniques, and the working image may be generated as a diffraction image of a segment of this area or of the entire area. Of course, the working and the orientation images may also be generated in the same form, e.g., in the form of a diffraction image, and to merely effect a variation of the size of the object area viewed between the orientation and working images.

In both scanning electron microscopes and trasmission-type stationary-image electron microscopes, the invention has the advantage that damage to the specimen examined is minimized since the object area reproduced as the orientation image need be exposed for generating the image picture only once.

These and other novel features and advantages of the invention will be described in greater detail in the following detailed description.

BRIEF DESCRIPTION OF THE DRAWINGS

FIG. 2 is a schematic electrical diagram of an electronic window circuit of the object imaging apparatus illustrated in FIG. 1;

FIG. 4 is a schematic electrical diagram of a switching circuit of the object imaging apparatus illustrated in FIG. 3.

DETAILED DESCRIPTION

Figure 1:
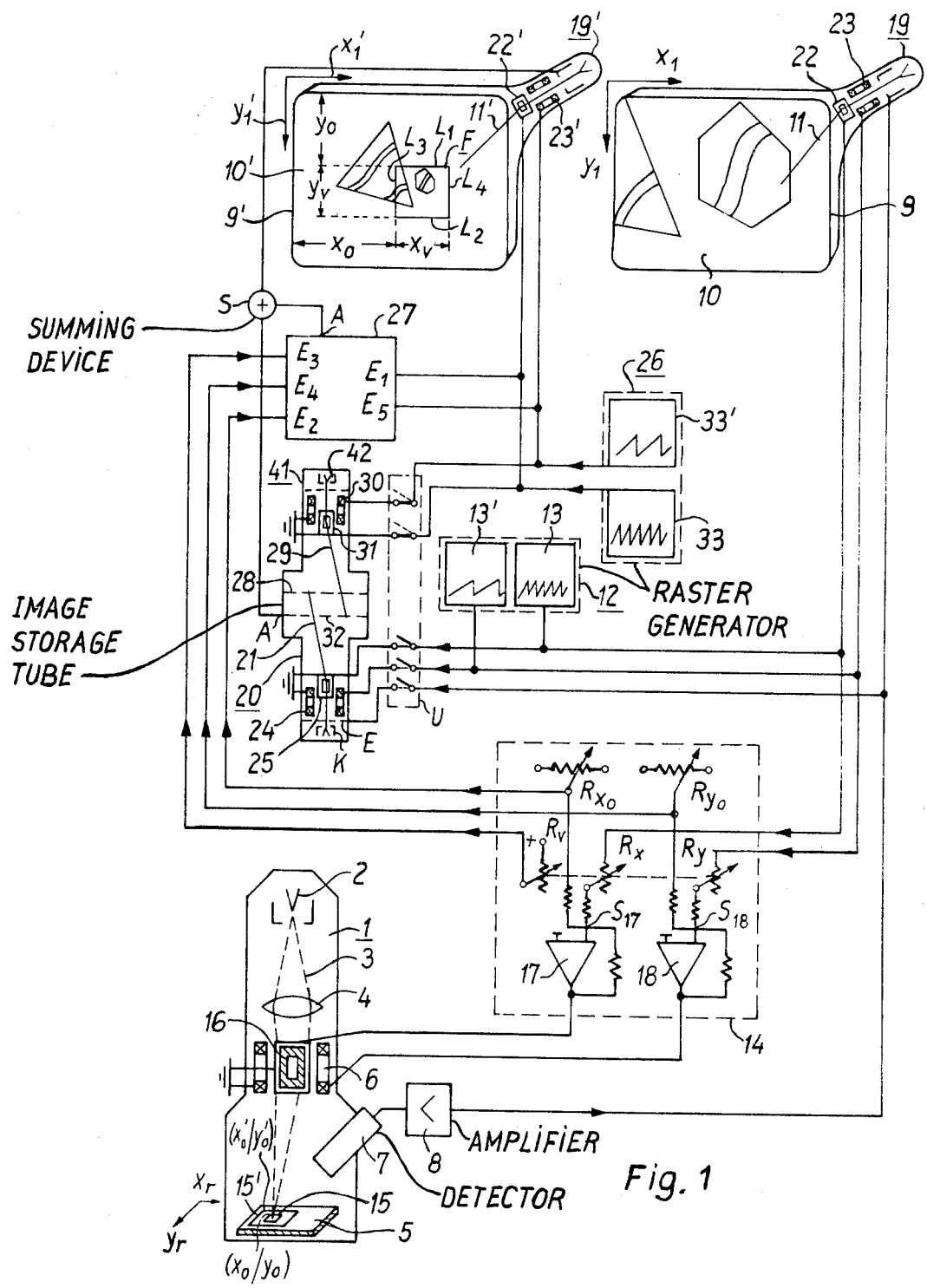
FIG. 1 is a schematic diagram of an object imaging apparatus for use in conjunction with a scanning electron microscope for carrying out an improved method for pictorially displaying output information generated in the form of an electrical signal by the object imaging apparatus in accordance with the present invention.

Referring now to the drawings, in particular to FIG. 1, there is shown a schematic diagram of a scanning electron microscope 1 which includes a cathode 2 for generating an electron beam 3 and an optical lens system 4 for focusing the beam on a specimen or object 5. Two pairs of deflection coils 6 and 16 are provided in the microscope for deflecting the focused electron beam in raster-fasion over the specimen. A detector 7 is provided for collecting secondary electrons emanating from specimen 5 (the output information generated by the microscope) and generating an electrical signal representative of the collected electrons which is transmitted to an amplifier 8 coupled to the detector. The electrical signal generated is a bright-modulation (unblanking) signal $I_r$ which is transmitted to a screen 9 of a television display tube 19. Electron beam 11 of tube 19 is synchronized with electron beam 3 of microscope 1. Deflection of the electron beams is controlled by a means of a raster generator 12 which deflects electron beam 11 in the deflection directions $x_l$ and $y_l$ and electron beam 3 in the deflection directions $x_r$ and $y_r$. The raster generator comprises a line generator 13 and a line advance generator 13' which generate sawtooth voltage signals and transmit the voltage signals to deflection coils 6 and 16 of the microscope and to deflection coils 22 and 23 of television tube 19. An image of a segment of specimen 5 is thus generated on screen 9 of tube 19. This generated image comprises a so-called "working" image 10.

A second television display tube 19', which is of the same design as television tube 19, is provided for displaying an orientation image 10' which is generated by changing the operating parameters of scanning electron microscope 1 from those utilized to generate working image 10. The orientation image is generated before the working image is generated and is stored in an electronic image storage tube 20. The image storage tube includes in input grid E which is electrically coupled to amplifier 8 and modulates the "writing" input beam 21 of the image tube. Beam 21 is generated by an electron source K provided in the tube which is synchronously controlled with electron beam 3 of microscope 1 by raster gnerator 12. Beam 21 is deflected by means of pairs of deflection coils 21 and 25. Orientation image 10' is impressed upon a storage grid 28 of the image storage tube by electron beam 21.

Orientation image 10' is taken, i.e., generated, once. After the image is generated, i.e., after one frame is scanned, a switch U opens the electrical connection between raster generator 12 or amplifier 8 and storage tube 20. The switch simultaneously electrically connects an additional raster generator 26 to a "read" portion 41 of image storage tube 20. After these operations, the electrical contacts of switch U are in the positions illustrated in FIG. 1 of the drawings.

An electron gun is disposed within the "read" portion 41 of tube 20 for generating the so-called "read" beam 29 of tube 20. The "read" portion of the tube also includes pairs of deflection coils 30 and 31 for deflecting "read" beam 29. Raster generator 26 is similar to generator 12 and comprises a line generator 33 and a line advance generator 33'. These generators generate sawtooth voltage signals having periods which are substantially smaller than the periods of the sawtooth voltage signals generated by generators 13 and 13'.

In operation, orientation image 10' is read from image storage tube 20 in the following manner:

Deflection coils 30 and 31 guide read beam 29 in raster fashion over an area 32 of image storage tube 20 and the intensity of beam 29 striking area 32 is modulated by the orientation image stored on the storage grid of tube 20. A summing device S, e.g., an adder, transmits the intensity of the electrons striking area 32 to television display tube 19' as the brightness modulation signal. Raster generator 26 is coupled to deflection coils 22' and 23' of tube 19', and, thus, the deflection of electron beam 11' of tube 19' is synchronized with the deflection of read beam 29 of storage tube 20. The orientation image 10' is thus obtained on television screen 9' of tube 19'. And because the periods of the sawtooth voltage signals generated by generators 33 and 33' are, as previously explained, smaller in magnitude than the periods of the sawtooth voltage signals generated by generators 13 and 13', the reproduction of orientation image 10' on display tube 19' is achieved at a greater speed than the speed at which the image is written into image storage tube 20.

The orientation and working images of the microscope are generated with different operating parameters of the microscope, the variation of which can be accomplished in different ways. For example, in the embodiment of the invention illustrated in FIG. 1, the image of object area 15 is reproduced as the working image 10, which is disposed within the object area 15'. Object area 15' provides the orientation image 10' and, as a result, images 10 and 10' display two areas of the specimen 5 with different magnifications.

The object areas 15 and 15' which are scanned by electron beam 3 are determined by a control circuit 14 coupled between raster generator 12 and deflection coils 6 and 16 of microscope 1. This control circuit comprises a pair of summing amplifiers 17 and 18 which control the deflection of beam 3 in deflection directions $x_r$ and $y_r$. The amplifiers include summation input terminals S17 and S18 to which two voltage signals are transmitted, one of which always has a fixed voltage value and fixes the location of the corner of the scanned object area. In the object area 15, this point is identified by the reference characters $x_0/y_0$ and in the object area 15', this point is identified by the reference characters $x'_0/y'_0$. The other of the two voltages is variable and is proportional in magnitude to the output voltage generated by the associated one of the sawtooth generators 13 and 13'. This second voltage signal determines the size of the scanned object area.

Setting of the starting coordinate and the size of the scanned object area is accomplished by means of variable resistors $R_{x_o}$, $R_{y_o}$, $R_x$ and $R_y$. The latter two resistors are mechanically coupled to each other to assure that the ratio of the width to height of a scanned object area is equal to the ratio of the width to height of the images 10 and 10'. After the four resistors are set, the object area 15' (the orientation image) is scanned for this setting. The resistances of the resistors are then increased for scanning object area 15 (the working image). When the resistances of resistors $R_{x_o}$ and $R_{y_o}$ are increased, the starting point of the scanned object area is shifted, whereas when the resistance of resistors $R_x$ and $R_y$ are increased, the dimensions of the scanned object area are decreased.

Control circuit 14 includes a variable resistor $R_\nu$ which is mechanically coupled to resistors $R_x$ and $R_y$. This resistor is connected to a voltage source (not shown) and it generates a voltage signal which is proportional to the dimensions of the scanned object area. This voltage signal is, thus, an indication of the magnification of the object area which is examined.

An electronic circuit 27 for recognizing the position and size of object area 15 relative to object area 15' is illustrated in FIG. 2. This electronic "window" circuit brightens a marking window F disposed within orientation image 10' and includes five input terminals E1, E2, E3, E4 and E5 and an output terminal A. Input terminal E1 is connected to line generator 33; input terminal E2 is connected to resistor $R_{x_o}$; input terminal E3 is connected to resistor $R_\nu$; input terminal E4 is connected to resistor $R_{y_o}$; and input terminal E5 is connected to line advance generator 33'. Output terminal A is electrically connected to summing device S.

Circuit 27 comprises a pair of summing amplifiers $S_u$ and $S_v$, a plurality of comparators K1, K2, K3 and K4, a plurality of AND gates U1, U2, U3 and U4 coupled to the comparators and the summing amplifiers, a pair of monostable multivibrators M1 and M2 coupled to the comparators, and an OR gate O coupled to AND gates U3 and U4 and output terminal A. The output voltage of each of the comparators changes from a low voltage L to a high voltage H if the voltage signal at the input terminal $e$ is equal to or exceeds the voltage signal at input terminal $f$. Thus, if the line advance voltage is the same as or larger than the voltage corresponding to the coordinate $x_o$, the output voltage of comparator K1 will change from low to high. One of the two input terminals of AND gates U1 and U2 is always inverted, and the delay time is equal to the period of line generator 33, for example, 64 usec., and that of multivibrator M1, for example, 0.5 usec.

Marking window F is formed by two horizontal bars L1 and L2 and a pair of vertical bars L3 and L4 (shown in FIG. 1). Unblanking of bars L1 and L2 is controlled by AND gates U4 which transmits an output signal to OR gate O when a signal is present at both input terminals of the gate. This occurs for bar L1 when the line advance voltage is equal to the voltage corresponding to coordinate $y_o$ and a signal is transmitted to multivibrator M2, and, in addition, the line deflection voltage is disposed between voltage values corresponding to the coordinate $x_0$ and the coordinate $x_0+x_\nu$. The latter coordinate exists at the output terminal of summing amplifier $S_u$. The reference character $x_\nu$ represents the desired length of bar L1 which is determined by the output signal generated by AND gate U1.

Vertical bars L3 and L4 comprise strips which are written one below the other. The width of the strips is determined by the delay time of monostable multivibrator M1 which may comprise 0.5 usec. These strips are written when the line advance voltage is equal to the voltage corresponding to coordinate $x_0$ or the coordinate $x_0+x_\nu$, and when the line advance voltage lies between the voltage values corresponding to the coordinate $y_0$ and the coordinate $y_0+y_\nu$. The coordinate length $y_0+y_\nu$ is determined by the voltage present at the output terminal of summing amplifier $S_\nu$. The reference character $y_\nu$ represents the length of the bars L3 and L4 which is proportional to the length $x_\nu$.

Figure 3:
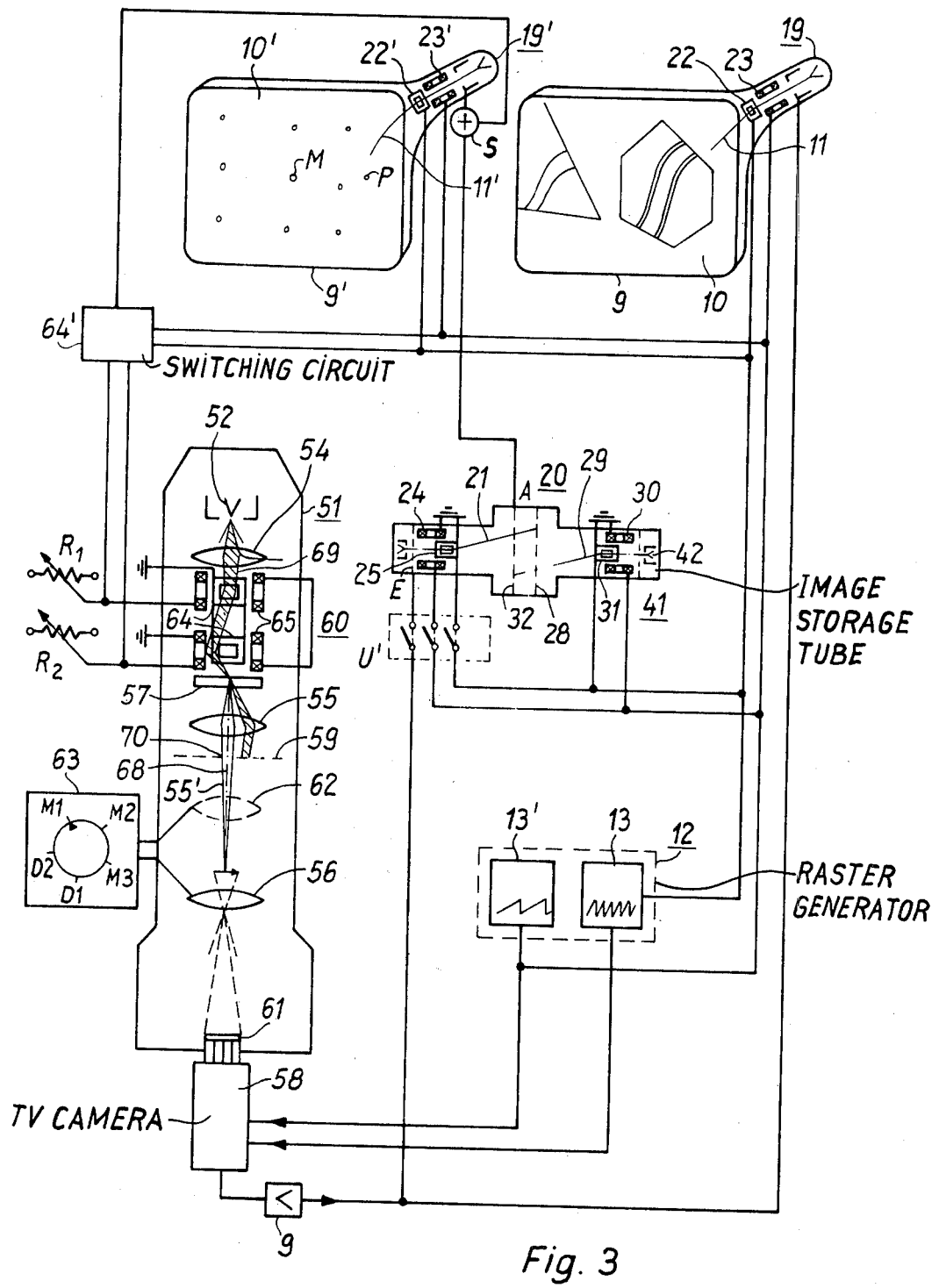
FIG. 3 is a schematic diagram of an object imaging apparatus for use in a stationary-image transmission-type electron microscope for carrying out an improved method for pictorially displaying output information generated in the form of an electrical signal by an object imaging apparatus in accordance with the present invention.

FIG. 3 schematically illustrates the application of the inventive method in a stationary-image transmission-type electron microscope. This microscope, identified by the reference numeral 51, includes a beam source 52, a condenser lens 54, an objective lens 55, a diffraction lens 62, and a projection lens 56. The specimen which is examined is identified by the reference numeral 57. The microscope image of specimen 57 is detected by a television camera 58 disposed at the lower end of the microscope along its optical axis.

In this embodiment of the invention, orientation image 10' is a diffraction image of an area of the specimen and working image 10 is a stationary image obtained by the usual techniques. The orientation image is generated first by generating a diffraction image in the rear focal plane of objective lens 55 and imaging the diffraction image, after magnification by projection lens 56, on transparent fluorescent screen 61 disposed in front of television camera 58 by means of diffraction lens 62. This diffraction image is written into electronic storage tube 20 in the same manner as described with reference to the apparatus illustrated in FIG. 1. A switch U' has its contacts disposed in the position shown in FIG. 3 of the drawings by the dotted lines during generation of the orientation image. After the orientation image is completely written into tube 20, the contacts of switch U' are disposed in the positions shown by the solid lines in FIG. 3. Orientation image 10' is displayed on television screen 9' of tube 19' in the same manner as described with reference to FIG. 1.

After the generation of orientation image 10', the operating parameters of the electron microscope are changed as follows:

An aperture diaphragm 59, illustrated in the drawings by a dashed line, is moved into the path of the electron beam of microscope 51. The excitation of diffraction lens 62 and projection lens 56 is then changed and a deflection coil system 60 is switched on. The latter deflection system enables the electron beam 69 of microscope 51 to be tilted and comprises two pairs of deflection coils 64 and 65 which are operationally effective at right angles with respect to each other and to axis 68 of the microscope. Coils 64 and 65 are energized by means of variable resistors R1 and R2 which are coupled to suitable voltage sources (not shown). If beam 69 is deflected out of the area of aperture 70 of diaphragm 59, a dark field image is generated on the fluorescent screen 61 by a beam of scattered electrons identified by the reference numeral 55'. This image is detected by camera 58 and is reproduced on screen 9 of tube 19 as working image 10.

The working image 10 depends upon the tilt of the scanning electron beam 69 relative to axis 68 of microscope 51. In order to render the tilt visible, the setting of resistors R1 and R2 is symbolized on screen 9' by an unblanked dot P. The distance of dot P from the center M of television screen 9' in the horizontal direction is proportional to the output signals of resistor R1 and the distance in the vertical direction to the output signal of resistor R2. The proportionality factor is chosen so that point P identifies the diffraction reflex in orientation image 10', the dark field image of which is reproduced on fluorescent screen 9. Unblanking of point P is achieved by circuit 64 to which the output signals produced by resistors R1 and R2 are transmitted along with the output signals generated by generators 13 and 13'.

Only one raster generator 12 is provided in the embodiment of the imaging apparatus illustrated in FIG. 3. This rastor generator synchronously controls the deflection coils (not shown) of television camera 58 as well as deflection coils 24 and 25 and 30 and 31 of image storage tube 20, and deflection coils 22 and 23 and 22' and 23' of television tubes 19 and 19'.

FIG. 4 schematically illustrates the switching circuit 64' shown in FIG. 3. The circuit comprises a pair of summing devices $S_x$ and $S_y$, such as, for example, an adder, comparators K5 and K6 coupled to the summing devices, monostable multivibrators M3 and M4 coupled to the comparators, and an AND gate U5 coupled to the multivibrators. The line deflection voltage and the line advance voltage, respectively, of raster generators 13 and 13' are transmitted to comparators K5 and K6 in addition to additional voltage signals each of which comprises two distinct parts. One part of each signal is constant, and the other is proportional to the settings of resistors R1 and R2. The constant voltage value, generated by resistors 76 and 77, is chosen so that the marking point P is in the center M of television screen 9' when deflection system 60 is not energized. Under this condition, television screen 9 displays a bright field image of the specimen or object. The output signals generated by comparators K5 and K6 are transmitted to multivibrators M3 and M4. The delay of multivibrator M3 is preferably 0.4 usec., and that of multivibrator M4 is preferably 64 usec., i.e., one line period of television tubes 19 and 19'.

Although the invention has been described with reference to scanning and stationary-image transmission-type electron microscopes, it should be noted that the methods described herein can also be utilized in other object imaging apparatus, such as, for example, ion microscopes, thermal radiation profile recording equipment, and X-ray examining equipment.

In the foregoing, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a method for pictorially displaying output information generated in the form of an electrical signal by an object imaging electron microscope, said microscope including a first display means for visually displaying a working image of said object and a second display means for visually displaying an orientation image of said object, said orientation image being obtained by varying the operating parameters of said microscope and being displayed simultaneously with said working image, the improvement comprising the steps of
generating the orientation image once,
storing said orientation image in an image storage means,
reproducing said orientation image from said generated image stored in said image storage means, and
linking said orientation image to said working image by means of a reference marking.

2. The method recited in claim 1, wherein said step of storing comprises storing said orientation image in an electronic image storage tube.

3. The method recited in claim 1, wherein said output information is generated by a scanning electron microscope.

4. The method recited in claim 1, wherein said output information is generated by a stationary-image transmission-type electron microscope.

* * * * *